US009784888B2

(12) United States Patent
Naik et al.

(10) Patent No.: US 9,784,888 B2
(45) Date of Patent: Oct. 10, 2017

(54) TITANIUM NITRIDE BASED METAMATERIAL

(71) Applicant: Purdue Research Foundation, West Lafayette, IN (US)

(72) Inventors: Gururaj Naik, West Lafayette, IN (US); Bivas Saha, West Lafayette, IN (US); Timothy Sands, West Lafayette, IN (US); Vladimir Shalaev, West Lafayette, IN (US); Alexandra Boltasseva, West Lafayette, IN (US)

(73) Assignee: PURDUE RESEARCH FOUNDATION, West Lafayette, IN (US)

( * ) Notice: Subject to any disclaimer, the term of this patent is extended or adjusted under 35 U.S.C. 154(b) by 364 days.

(21) Appl. No.: 14/434,697

(22) PCT Filed: Oct. 9, 2013

(86) PCT No.: PCT/US2013/064057
§ 371 (c)(1),
(2) Date: Apr. 9, 2015

(87) PCT Pub. No.: WO2014/099110
PCT Pub. Date: Jun. 26, 2014

(65) Prior Publication Data
US 2015/0285953 A1 Oct. 8, 2015

Related U.S. Application Data

(60) Provisional application No. 61/711,548, filed on Oct. 9, 2012.

(51) Int. Cl.
*G02B 1/00* (2006.01)
*G02B 5/00* (2006.01)
(Continued)

(52) U.S. Cl.
CPC ............ *G02B 1/002* (2013.01); *B32B 9/00* (2013.01); *G02B 5/008* (2013.01);
(Continued)

(58) Field of Classification Search
CPC .................. G02B 1/002; G02B 5/008; Y10T 428/24975; B32B 9/00; Y10S 977/761
See application file for complete search history.

(56) References Cited

U.S. PATENT DOCUMENTS

2010/0126567 A1* 5/2010 Kaufman ............... G02B 5/008
136/252

OTHER PUBLICATIONS

Naik et al, "A Titanium Nitride based Metamaterial for Applications in the Visible", CLEO:2013 Technical Digest (2013).*
(Continued)

*Primary Examiner* — Eric Bolda
(74) *Attorney, Agent, or Firm* — Purdue Research Foundation

(57) ABSTRACT

A titanium nitride-based metamaterial, and method for producing the same, is disclosed, consisting of ultrathin, smooth, and alternating layers of a plasmonic titanium nitride (TiN) material and a dielectric material, grown on a substrate to form a superlattice. The dielectric material is made of $A_{1-x}Sc_xN$, where 'x' ranges in value from 0.2 to 0.4. The layers of alternating material have sharp interfaces, and each layer can range from 1-20 nanometers in thickness. Metamaterials based on titanium TiN, a novel plasmonic building block, have many applications including, but not 'limited to emission enhancers, computer security, etc. The use of nitrogen vacancy centers in diamond, and light emitting diode (LED) efficiency enhancement is of particular interest.

18 Claims, 8 Drawing Sheets

(51) Int. Cl.
*B32B 9/00* (2006.01)
*H01L 51/52* (2006.01)
*B82Y 20/00* (2011.01)

(52) U.S. Cl.
CPC .......... *H01L 51/5262* (2013.01); *B82Y 20/00* (2013.01); *Y10S 977/761* (2013.01); *Y10T 428/24975* (2015.01)

(56) References Cited

OTHER PUBLICATIONS

West et al. "Searching for better plasmonic materials", Laser Photonics Rev. 4, No. 6, pp. 795-808 (2010).*
Shalaginov, M. Y., et al., Enhancement of single-photon emission from nitrogen-vacancy centers with TiN/(Al,Sc)N hyperbolic metamaterial. Laser Photonics Rev., 1-8 (2014) / DOI 10.1002/lpor.201400185.
Naik, G. V., et al., Epitaxial superlattices with titanium nitride as a plasmonic component for optical hyperbolic metamaterials. 2014. www.pnas.org/cgi/doi/10.1073/pnas.1319446111.
Saha, B., et al., Development of epitaxial AlxSc1-xN for artificially structured metal/semiconductor superlattice metamaterials. Phys. Status Solidi B, 1-9 (2014) / DOI 10.1002/pssb.201451314.

* cited by examiner

US 9,784,888 B2

TITANIUM NITRIDE BASED METAMATERIAL

CROSS-REFERENCE TO RELATED APPLICATIONS

This patent application claims priority to, and incorporates fully by reference, and is a U.S. §371 national stage entry of, International Patent Application Serial No. PCT/US2013/064057 filed Oct. 9, 2013 which is related to and claims priority to U.S. Provisional Patent Application No. 61/711,548, filed Oct. 9, 2012. All of the above applications are incorporated by reference in their entirety.

STATEMENT REGARDING FEDERALLY SPONSORED RESEARCH

This invention was made with government support under DMR1120923 awarded by the National Science Foundation; N00014-10-1-0942 awarded by the U.S. Navy Office of Naval Research; and W911NF-11-1-0359 awarded by the U.S. Army Research Office. The government has certain rights in the invention.

FIELD OF THE INVENTION

This invention relates to metamatetials operating in optical and near-infrared spectral ranges. The claimed material and method is used in compact optical systems and other micro-scale technologies.

BACKGROUND OF THE INVENTION

The realization of optical hyperbolic metamaterial (HMM) devices is hindered by the fact that metals (used as HMM subwavelength building blocks) with their large negative permittivity and high losses in the optical frequency range are detrimental to HMM performance, leading, for example, to a very poor transmission through the HMMs. Moreover, in order to achieve significant enhancement of PDOS (photonic density of states), the individual HMM layers need to be as thin as possible (PDOS in a HMM is inversely related to the cube on the layer thickness). Noble metal films (i.e. gold or silver) currently used to create HMM structures cannot be patterned into ultra-thin layers without compromising their quality, which leads to additional losses. Thus, realization of metal-based HMMs with deep subwavelength layers and good optical performance is extremely challenging. Moreover, neither gold nor silver offers thermal stability and silicon CMOS compatibility, which is required far many technology-driven applications. The present invention offers an alternative material as a building block for HMMs and new metamaterial-based technological applications.

SUMMARY OF THE INVENTION

The claimed material and method for producing the same comprise ultrathin and smooth layers of alternating materials, which make up a superlattice structure that is grown on a substrate made of MgO. The substrate should preferably remain at 750° C. during deposition. The materials grown on the substrate are comprised of titanium nitride, a plasmonic material, and $Al_{1-x}Sc_xN$, a dielectric material. Each individual material layer can range from 1 to 20 nanometers in thickness, and "x" in $Al_{1-x}Sc_xN$ can range from 0.2 to 0.4. Due to an enhanced hyperbolic dispersion, the material can achieve a photonic density of states up to 10 times the current state of the art. A broad band emitter comprising a nitrogen vacancy center in diamond can be coupled with the alternating ultrathin layers, a spacer layer, and another plasmonic or dielectric material, to create an emission enhancer based on a single photon generator. A light emitting diode can also be coupled with at least one plasmonic or dielectric material for outcoupling light to provide an increase in LED efficiency.

DETAILED DESCRIPTION OF THE PREFERRED EMBODIMENT

The present invention discloses titanium nitride based metamaterial as an alternative plasmonic material in the visible and near-infrared spectral regions. This disclosure demonstrates the excitation of surface-plasmon polaritons (SPPs) on titanium nitride thin films. Titanium nitride provides performance that is comparable to that of gold for plasmonic applications, and it significantly outperforms gold and silver for transformation-optics and some metamaterial applications in the visible and near-infrared optical regions.

Transition metal nitrides (such as TiN) are ceramic materials whose stoichiometry can be varied by tuning the growth condition. In other words, the composition and hence the optical properties depend significantly on the preparation method and conditions. Some of these nitrides possess metallic properties at visible wavelengths because of large free carrier concentrations ($\approx 10^{22}$ cm$^{-3}$). High interband losses make many of these compounds unattractive for plasmonic applications. Titanium nitride, however, exhibits smaller interband losses in the red part of the visible spectrum and a small negative real permittivity. It is therefore a material of significant value for plasmonic applications in the visible and near-IR spectral ranges.

To manufacture the metamaterial, thin films of titanium nitride are deposited on glass or c-sapphire substrates by DC reactive magnetron sputtering (PVD Products Inc.) from a 99.995% titanium target in an argon-nitrogen environment. The base pressure within the chamber before deposition is $2\times 10^{-7}$ Torr. The films are deposited at a deposition pressure of 5 mTorr with varying flow ratios of argon and nitrogen (Ar (sccm):N$_2$ (sccm) of 4:6, 2:8 and 0:10). The sputtering power is held constant for all depositions at 200 W (DC) and the target-substrate distance is 8 cm. The deposition rate is approximately 25° A/min and about 30 nm thick films are deposited. The substrate temperature during deposition is held at 300° C. or 500° C. The resulting films are characterized by a variable angle spectroscopic ellipsometer (V-VASE, J. A. Woollam Co.) in the near-IR, visible, and near-UV wavelength ranges. A Drude-Lorentz (with three Lorentz oscillators) model provides a good fit to the ellipsometric measurements. The Drude part of the model captures the part of the optical response arising from free carriers, while the Lorentz oscillators account for the interband losses. The substrate temperature also affects the optical properties of these films. After TiN films depositions at substrate temperatures of 300° C. and 500° C. with the Ar:N2 flow ratio fixed at 4:6, the film deposited at the higher temperature shows lower loss.

Figure 1:
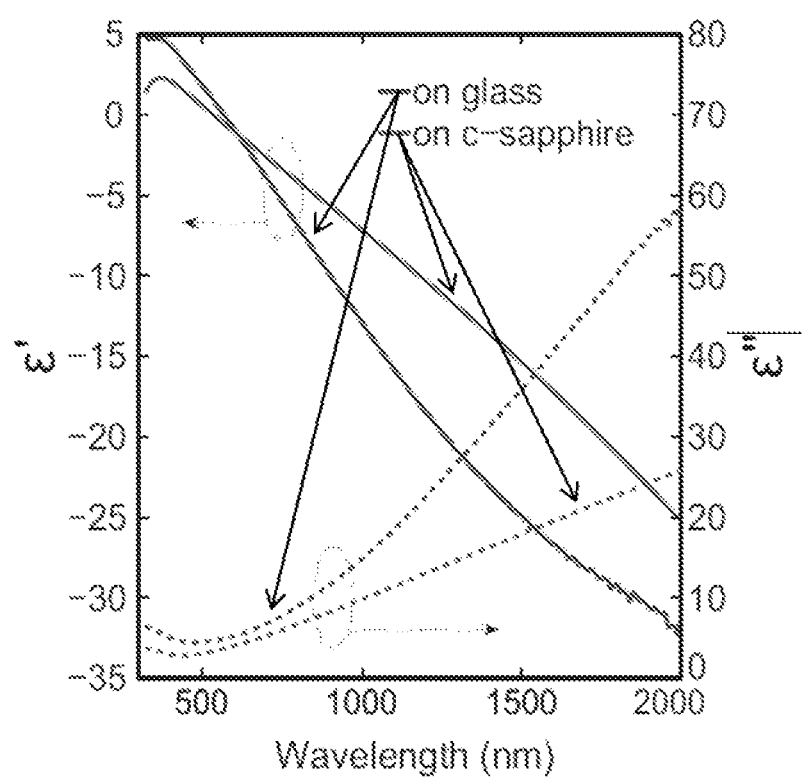
FIG. 1. Dielectric functions of titanium nitride films deposited at 300° C. on glass and c-sapphire substrates.
Figure 2:
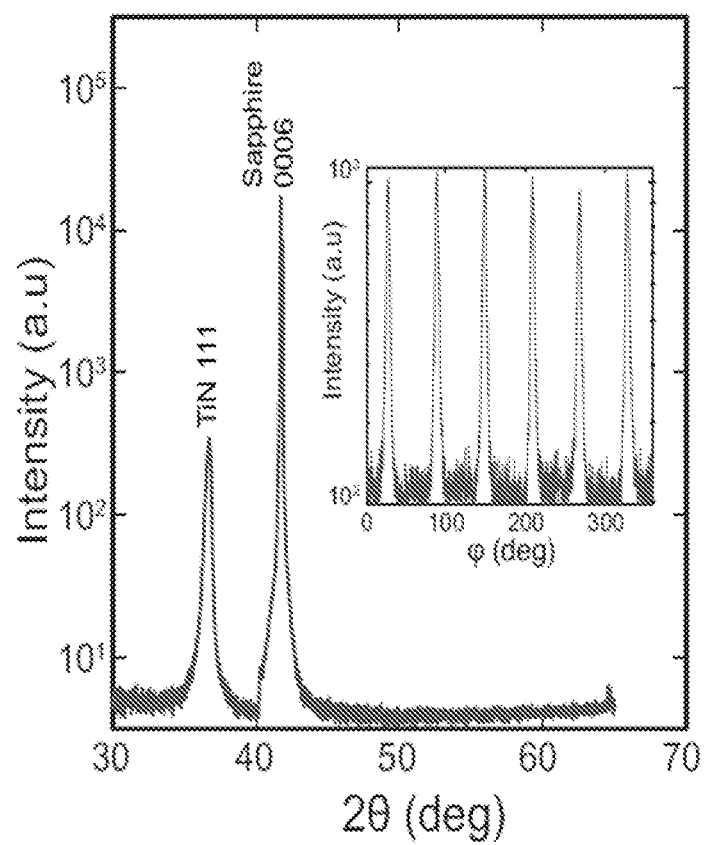
FIG. 2. X-ray diffraction spectra showing the diffraction intensity from a TiN thin film grown on c-sapphire. The peaks in the intensity correspond to the crystal planes annotated. The inset shows the intensity plot for an asymmetric-phi scan with 2θ set to the 200 reflection of TiN and off-plane tilt angle ($\chi$) set to 54.7 degrees corresponding to inter-planar angle between (111) and (200) planes.

The optical properties of TiN thin films also depend strongly on the substrate on which they are grown. Substrates such as sapphire and MgO provide lattice matching and promote epitaxial growth, leading to crystalline films and thereby reducing optical losses. Substrates such as glass do not provide lattice matching, and polycrystalline films are obtained, which can have higher losses due to additional carrier scattering. The optical properties of a TIN film grown on c-sapphire and glass are shown in FIG. 1. The film grown on glass shows lower carrier concentration and higher losses than the film grown on c-sapphire. In order to verify if c-sapphire allows epitaxial growth of TiN films, X-ray diffraction (Phillips X'Pert Pro) measurements were performed. The diffraction intensity plot for TiN thin films on c-sapphire substrate is shown in FIG. 2. The 2θ-ω plot shows two peaks corresponding to the 111 reflection from TiN and the 0006 reflection from sapphire substrate. TiN film on c-sapphire grows with 111 directions. Further, the epitaxial growth of TiN on c-sapphire is confirmed by performing an asymmetric-phi scan. In this measurement, the x-ray detector (2θ) and the incidence angle at the sample (ω)) are fixed at values corresponding to the 200 reflection. The off-plane tilt of the sample ($\chi$) is set to 54.7 degrees corresponding to the interplanar angle between (200) and (111) planes. Epitaxial growth would be evidenced by peaks corresponding to three 200 reflections when the sample is rotated by 360 degrees. The inset in FIG. 2 shows the result of an asymmetric-phi scan on a TiN film deposited on a c-sapphire substrate. The six sharp peaks observed in this measurement confirm mutivariant epitaxial growth of TiN on c-sapphire.

Epitaxial growth of TiN thin films on c-sapphire produces films that have low roughness and are uniformly textured, which is confirmed by atomic force microscope (AFM) and scanning electron micrograph (SEM) images of a TiN film on a c-sapphire substrate. The root-mean-square (rms) roughness of the film is measured to be about 0.4 nm. Although the film is smoother than a polycrystalline film, the boundaries between domains of epitaxial variants of cubic TiN introduce a degree of roughness. TiN is a plasmonic building block for different applications such as SPP waveguides, superlattices, localized surface plasmon resonance (LSPR) devices, hyperbolic MMs, and general transformation optics devices.

Examples of Possible Applications
Plasmonic Applications.

Silver currently offers the best SPP (surface plasmon polariton) characteristics. However, problems in fabricating thin films of silver and its chemical reactivity in air preclude it from being useful for some applications. Gold is better due its chemical stability, but it poses other problems arising from nanofabrication such as poor adhesion to substrates and the formation of percolating or semi-continuous films when the thickness is around 10 nm or lower. Such problems arising from the growth and morphology of gold films result in additional optical losses, which can be described by a phenomenological quantity called the loss factor. The comparison of TiN and gold shows that TiN gives a slightly better confinement than gold, but the propagation length for TiN is smaller than that for gold. The characteristics of TiN resemble that of gold with a loss factor of 3.5. As a comparison point, a loss factor of 3.5 or higher is commonly observed in nanopatterned gold structures. Thus, TiN qualifies as a viable substitute for silver and gold in the manufacture of metamaterials, and in fact is superior to gold and silver, due to characteristics such as CMOS compatibility, greater mechanical toughness and chemical stability, lower optical loss, greater thermal stability (melting point>2700° C.), ultra-thin, smooth, and crystalline epitaxial growth on various substrates (including sapphire, MgO and silicon), tunable optical properties, biocompatibility, and higher PDOS enhancement.

Instead of the simple case of SPPs propagating along a single interface, more complicated designs such as a metal-insulator-metal (MIM) wave guide geometry with TiN are also considered. The MIM configuration allows confinement of a significant portion of the electromagnetic field within the insulator and, hence, the propagation length of SPPs in this configuration is a fair index for comparing the performance of different plasmonic material systems. The experiments show that propagation length is smaller for the case of TiN compared to gold with a unity loss factor. However, the propagation length of a TiN waveguide is comparable to that of gold with a loss factor of 3.5.

In addition to propagating modes, localized surface plasmon resonance (LSPR) modes are useful in many sensing applications where localized field enhancement is of great importance. Metal nanoparticles can support LSPR modes and enable local-field enhancement. The field enhancements at the surface of TiN and gold nanospheres is calculated using the quasistatic dipole approximation. The resonance wavelength (which corresponds to the peak field enhancement) for TiN nanospheres is red-shifted compared to gold owing to TiN's smaller absolute real permittivity value. The magnitude of field enhancement in TiN nanospheres is slightly smaller than that of gold, but the overall performance of each material is comparable, making TiN a realistic alternative plasmonic material for LSPR applications.

Hyperbolic Metamaterials and Transformation Optics.

Figure 3:
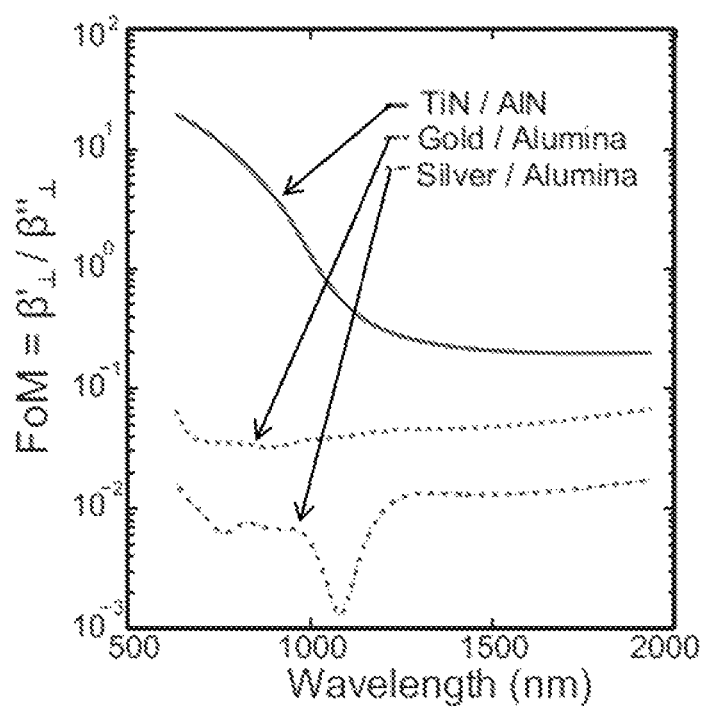
FIG. 3. Figures-of-merit for HMMs formed by alternating, sub-wavelength layers of different metal/dielectric combinations (TiN/AlN, silver/alumina, and gold/alumina).

Metamaterials with hyperbolic dispersion (i.e. HMMs) have unique properties such as the propagation of extremely high-k waves and a broadband singularity in the photonic-density-of-states (PDOS). In the visible spectrum however, neither gold nor silver can produce high-performance HMMs. To compare the performance, FIG. 3 shows the figures-of-merit of HMMs formed by alternating layers of silver/alumina, gold/alumina, and TiN/AlN. The calculations of figure-of-merit are based on standard effective medium approximation of the metal/dielectric stack for a metal filling fraction of 50%. Clearly, the TiN system outperforms the metal based systems in the red part of the visible spectrum. For wavelengths shorter than 500 nm, TiN is not plasmonic; therefore, the figure-of-merit values are shown only for wavelengths longer than 500 nm. TiN not only outperforms in its performance, but also provides an additional advantage in the fabrication of ultra-thin layers. Ultra-thin layers are necessary for producing truly binary HMM structure and TiN, unlike metals can be grown as an ultra-thin epitaxial layer.

Figure 4:
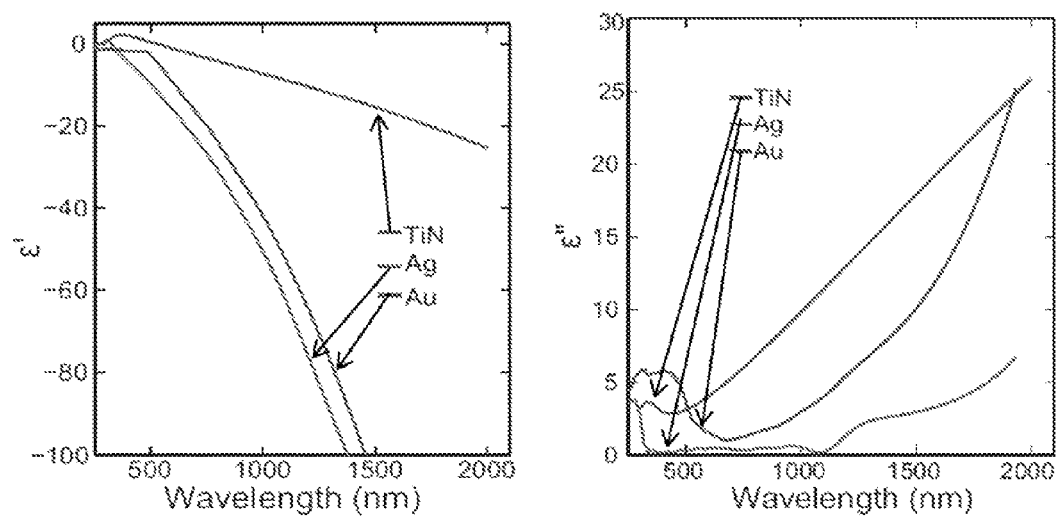
FIG. 4. Dielectric function of TiN in comparison with conventional plasmonic materials: gold (Au) and silver (Ag).

In general, transformation optics (TO) devices often require plasmonic components with real permittivity values that are on the order of unity. While none of the conventional metals satisfy this condition, titanium nitride does meet this criterion and is therefore a suitable material that could enable transformation optics in the visible range. As a comparison, the dielectric functions of TiN and bulk conventional metals are plotted in FIG. 4. The figure clearly shows the disadvantage of conventional metals in terms of the real part of permittivity. However, the imaginary part of permittivity, which signifies the losses in the material, is the lowest in the case of silver. TiN is better than gold only for longer wavelengths. In practical applications, it is rather difficult to obtain low, bulk-like losses in designs using silver because of problems such as surface roughness, grain-boundary scattering, and corrosion. Also, forming ultra-thin layers of silver or gold is difficult. On the contrary, TiN does not possess such difficulties and forms a better materials choice than conventional metals for TO applications.

TiN/$Al_{1-x}Sc_xN$ HMM Superlattices.

Figure 5:
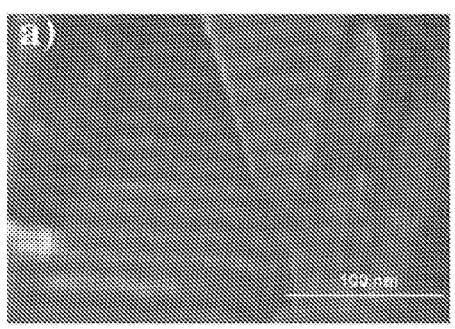
FIG. 5. (a) Cross-section SEM image showing the superlattice of TiN and $Al_xSc_{1-x}N$; (b) Figure-of-merit calculated for superlattices of $TiN/Al_{0.6}Sc_{0.4}N$, $TiN/Al_{0.65}Sc_{0.35}N$, and $TiN/Al_{0.7}Sc_{0.3}N$. The hyperbolic dispersion exists to wavelengths longer than the wavelength corresponding to the dashed vertical line in the plot.
Figure 5:
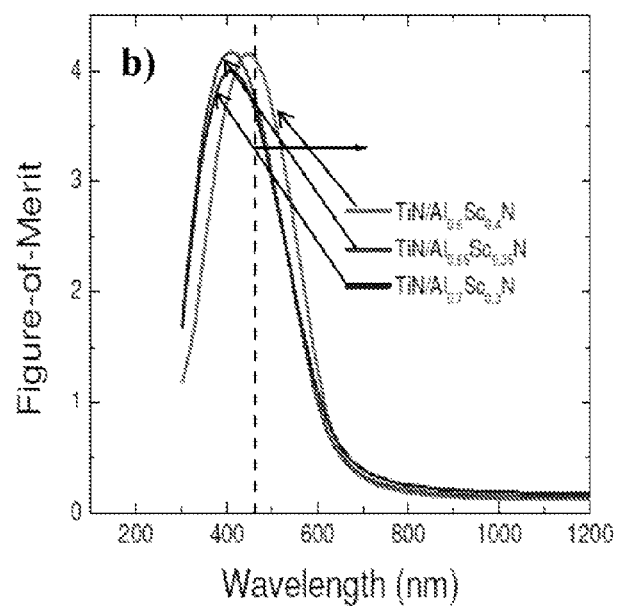

The fabrication of a good quality HMM requires ultrathin and smooth alternating layers of metal and dielectric with sharp interfaces. This is possible if the metal/dielectric superlattice is epitaxially grown, and TiN grows as an epitaxial film on MgO (100). A TiN/$Al_{0.72}Sc_{0.28}N$ and TiN/$Al_{0.6}Sc_{0.4}N$ superlattice are grown epitaxially on (001) MgO substrates by reactive dc-sputtering. High resolution XRD analysis along with the reciprocal space x-ray map suggests pseudomorphic 002 columnar superlattice grain growth on the MgO substrates with the grains separated by small angle grain boundaries. Epitaxial growth ensures sub-nanometer interface roughness and enables sub 10 nm smooth layers. Desirable optical properties of the dielectric component—$Al_{1-x}Sc_xN$—and the metallic component—TiN—are achieved by the optimization of the deposition process. AlN, when alloyed with 28% of ScN, is stabilized in the cubic rock salt phase and matches the lattice constant of TiN. Optimization of the growth of $Al_{1-x}Sc_xN$ thin films sandwiched between TiN layers reveals that $Al_{1-x}Sc_xN$ can be stabilized in the cubic phase and grows lattice matches on TiN. Thus, HMMs are prepared which comprise TiN as the plasmonic material and $Al_{1-x}Sc_xN$ as the dielectric material. A Transmission Electron Microscopy (TEM) image of the interface of TiN and $Al_{0.6}Sc_{0.4}N$ layers is shown in FIG. 5(a). According to the electron diffraction patterns recorded from the TN and $Al_{0.72}Sc_{0.28}N$ layers, sharp interfaces and perfect lattice matching are evident.

In order to probe the PDOS of the TiN/$Al_{0.72}Sc_{0.28}N$ HMM, the following experiment was conducted: A 300 nm thick HMM comprising 5 nm each of TiN and $Al_{0.72}Sc_{0.28}N$ layers (TiN is the top layer) is grown. On the top of this sample is grown a 5 nm thin spacer of $Al_{0.72}Sc_{0.28}N$. A 100 μM solution of LD800 dye in SU-8 (1:5 in thinner) is spin coated onto the HMM. The lifetime of the dye is measured using fluorescence lifetime imaging system (MicroTime 200 Picoquant). The pump wavelength is 635 nm (88 ps pulses) and the detection wavelength range spans from 650 nm to 720 nm. The average lifetime of dye on HMM was recorded to be 0.26 ns and that on bare MgO was 2.1 ns. A control sample was prepared comprising 5 nm thick $Al_{0.72}Sc_{0.28}N$ on top of 5 nm thick TiN film (on MgO substrate). The average lifetime of dye recorded on the control sample was 0.7 ns. Overall, there was nearly a 9× reduction in lifetime of dye molecules on TiN/$Al_{0.72}Sc_{0.28}N$ HMM compared to the bare substrate, and nearly a 3× reduction in lifetime compared to the control sample.

The optical properties extracted from ellipsometry measurements suggest that such a superlattice shows a strong uniaxial anisotropy with positive and negative real permittivity values in the two directions. This gives rise to a hyperbolic dispersion in this metamaterial, leading to many potential applications including but not limited to sub-wavelength resolution imaging, strikingly efficient sub-wavelength light concentration and extraction (e.g. light sources with dramatically increased photon extraction, non-resonant single photon sources), engineering absorption and emission from quantum emitters (i.e. breakthrough quantum technologies including the combination of these HMMs with wide-spectrum, room-temperature quantum emitters such as quantum dots and Nitrogen-Vacancy (NV) color centers in nanodiamonds and similar systems), ultra-compact resonators, and the use of nano-antennas, nano-apertures and metasurfaces to out-couple high-k modes in the HMM to free space. Additionally, these HMMs can transform an isotropic spontaneous emission profile into a directional one, leading to new types of light sources (e.g. LEDs, PLEDs). The figure-of-merit computed from the measured optical properties (see FIG. 5(b)) shows that this metamaterial has a figure-of-merit more than two orders higher than that of metal-based counterparts.

Furthermore, a single-photon source, which relies on the pulsed excitation of a single nitrogen-vacancy color centre in a diamond nanocrystal, is a core element of a quantum key distribution (QKD) system for secure data transmission. An important and unique property of quantum distribution is the ability of the two communicating users to detect the presence of any third party trying to gain knowledge of the key. The BB84 protocol is proven to be secure, relying on the quantum property that information gain is only possible at the expense of disturbing the signal. The process of measuring a quantum system in general disturbs the system. A third party trying to eavesdrop on the key must in some way measure it, thus introducing detectable anomalies. By using quantum superposition or quantum entanglement and transmitting information in quantum states, a communication system can be implemented which detects eavesdropping. In the case of eavesdropping, the communication is aborted and cyber security is provided.

Figure 7:
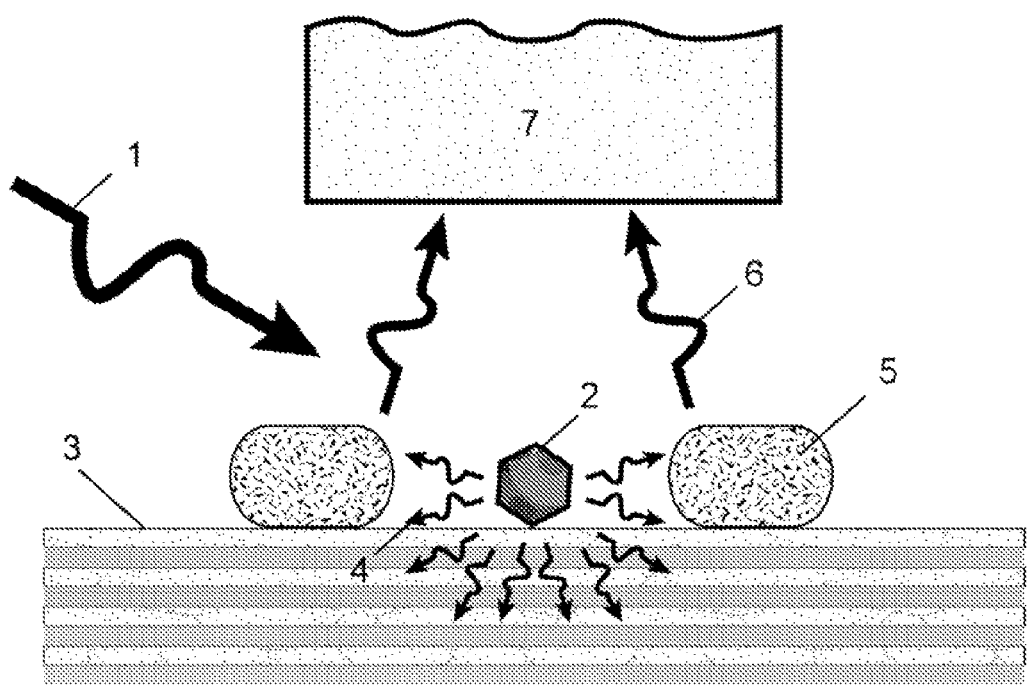
FIG. 7. An example realization of a single photon source employing TiN-based HMMs.

An example realization of a single-photon source is depicted in FIG. 7: An optical pump pulse 1 excites a single NV color center in a nanodiamond crystal 2 placed on an HMM substrate 3. The rate of spontaneous emission 4 radiated by the nanodiamond 2 is enhanced by the HMM layer 3. A nanoantena is used to outcouple spontaneously emitted photons 5 from the surface and volume waves of the HMM laser and then redirect them as focused propagating waves 6 into an optical waveguide 7 to be used in a specific application.

Methods

TiN/(Al,Sc)N superlattices are deposited on (001) oriented MgO substrates using reactive dc magnetron sputtering in a load-locked turbomolecular pumped high vacuum deposition system with a base pressure of $(2-5) \times 10^{-8}$ torr PVD Products, Inc.). The growth chamber has the capability to accommodate our targets and is equipped with three dc power supplies. Prior to the deposition, the substrates are cleaned in acetone, methanol, and dried in nitrogen gas. The Ti (99.99% purity,) Al (99.99% purity), and Sc (99.99%) targets have dimensions of 2 in. diameter and 0.25 in. thickness. All depositions are performed with an Ar/N2 mixture with the flow rates of Ar and N2 being 4 and 6 sccm, and a deposition gas pressure of 10 mTorr. The targets are sputtered in constant power mode. While the Ti target is fixed at 200 W, the Al and Sc target powers are varied to achieve the desired stoichiometry of (Al,Sc)N alloy layers, e.g., $Al_{0.7}Sc_{0.3}N$. The substrates are maintained at 750° C. during deposition, as determined using an infrared pyrometer operated in the wavelength range of 0.8-1.1 μm, together with a thermocouple.

The crystal orientation, texture and epitaxial relationship of the superlattices are determined by high-resolution X-ray diffraction (HRXRD) and high-resolution transmission electron microscopy (HRTEM) using Cu K α1 radiation in a Panalytical X-ray diffractometer and FEI 80-300 KeV transmission electron microscopy. The period thicknesses of the superlattices are determined from the separation of the satellite peaks in the 2 diffraction pattern of the superlattice as well as X-ray reflectivity measurements. Cross-sectional TEM samples structures were prepared on a FEI Nova 200 NanoLab DualBeam SEM/FIB using standard lift-out technique equipped with a Klocke nanomanipulator.

The dye layer on top of MgO, glass, superlattice samples and control samples is prepared using the following method: 100 μM concentration of LD-800 dye dispersed in 1:7 diluted SU8-200 polymer is sonicated for 5 min before spin coating it on top of all samples to achieve about 11 nm thick dye layer. The thickness of the dye layer is measured by spectroscopic ellipsometer (J. A. Woollam Co.).

Fluorescence Lifetime Imaging Microscopy (FLIM) measurement is performed based on a customized confocal microscopy (Microtime 200, PicoQuant GmbH, Berlin, Germany) with time-correlated single photon counting (TC-SPC) time-tagged time-resolved (TTTR) mode (Time Harp 200, PicoQuant GmbH, Berlin, Germany). Picosecond pulsed 633 nm laser line is utilized as an excitation source for LD-800 via 50×/0.75 NA objective (Olympus Inc.). The fluorescence signal is collected using the same objective backwardly and filtered from the excitation light by a dichroic mirror (z467/638rpc, Chroma). Overall fluorescence signal is further spectrally filtered by a 50 μm pinhole to exclude the background noise and out-of-focus fluorescence, and finally recorded by a single photon avalanche photodiodes (SPAD) (SPCM-AQR-14, PerkinElmer Inc.) after passing the 685-70 (Chroma) band pass filter (685-70 means that the filter is centered at 685 nm with a bandwidth 70 nm). The average lifetimes of the dyes molecules are calculated by fitting multiple exponential equations to the spontaneous decay curves measured.

Figure 6:
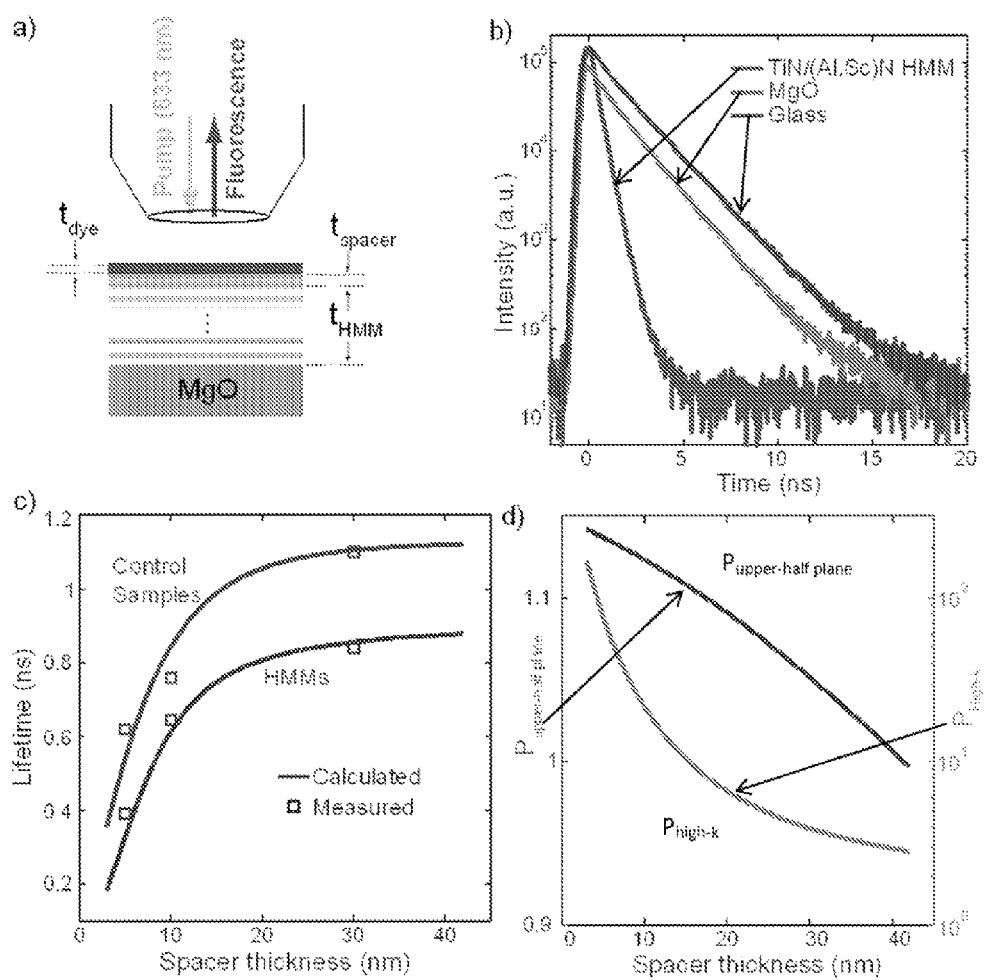
FIG. 6. Experiment to probe the photonic density of states of a HMM; (a) The schematic showing the sample geometry and the experiment configuration; (b) Measured spontaneous emission intensity vs. time profiles from dye molecules sitting on top of a TiN/(Al,Sc)N superlattice with individual layers 10 nm thick, bare MgO and bare glass substrates; (c) Lifetimes of dye molecules on TiN/(Al,Sc)N HMMs or 10 nm TiN film (control) as a function of the distance of separation from the top metal surface of the sample. The HMMs are composed of 24 layers each being 10 nm thick. The dye layer is separated from HMM/control sample surface by (Al,Sc)N spacer layer. The calculated emitter lifetimes (solid line) for different spacer layer thickness are fit to the measured values (squares); (d) Power emission and radiation as a function of spacer layer thickness.

For further verification, an emitter (LD-800 dye molecule) is placed close to the surface of the HMM (separated by a spacer layer made of (Al,Sc)N) and its lifetime is measured (see FIG. 6(a)). For the lifetime measurements, in addition to superlattice samples, control samples were also prepared which had a thin layer of metal (same thickness as in the superlattice) and a layer of spacer (same thickness as in superlattice sample) on top.

FIG. 6(b) shows the lifetime measurements on TiN/(Al, Sc)N HMM with 10 nm layers. The HMMs consisted of 12 pairs of layers plus an additional spacer layer on top. The spacer layer was made of the same dielectric, (Al,Sc)N that constituted the HMM. Three such HMMs with three different spacer layer thicknesses were fabricated. An approximately 11 nm thick layer containing dispersed dye molecules was spin-coated on top of the HMMs. The results of the lifetime measurements are shown in FIG. 6(c). The HMM with the thinnest spacer layer of 5 nm shows the smallest lifetime, while the HMMs with thicker spacer layers show much larger lifetimes. This is because the emitter closer to HMM couples high-k modes better into the HMM. Hence, more radiation channels are available for the emitter to radiate into the HMM, which reduces the lifetime. This trend is predicted where the cubic dependence of the emitter lifetime with the distance of emitter to the HMM surface. A nearly lossless HMM and an ideal emitter (quantum yield of 100%) would show such a dependence. However, in practice, HMMs have significant losses and the emitter is non-ideal. LDOS calculations are employed in order to predict the lifetime of the dye molecules sitting on top of HMM with different spacer thicknesses (see supporting information). If the radiation from the dipole μ(r0) is scattered by the HMM, and if the scattered field strength is Es(r), then the power (P) radiated by the dipole may be calculated from Equation (1) below. If the dipole emitter has less than 100% intrinsic quantum yield (Q), the spontaneous emission rate (Γ) of the emitter may be calculated using Equation (2) below, $P_0$ and $\Gamma_0$ are power and emission rates, respectively, of the emitter in a vacuum.

$$\frac{P}{P_0} = 1 + \frac{6\pi e_0}{|\mu|^2} \frac{1}{k^2} \operatorname{Im}\{\mu^* \cdot E_s(r_0)\} \quad (1)$$

$$\frac{\Gamma}{\Gamma_0} = (1 - Q) + Q\frac{P}{P_0} \quad (2)$$

The calculations made match well with experimental observations, confirming the enhancement of PDOS provided by TiN/(Al,Sc)N HMMs. In order to assess the role of plasmon in enhancing the PDOS, control samples are prepared consisting of 10 nm TiN film on MgO substrate with a top layer of (Al,Sc)N spacer. The spacer layer is 5, 10, and 30 nm thick in the three different samples. The dye layer is spin coated on top of these control samples by exactly the same technique as employed on HMMs. The results of lifetime measurements on these control samples are also shown in FIG. 6(c). The control samples provide enhancement in emission rate by nearly two times (in comparison to emission rate on bare glass). The surface plasmons supported at the top and bottom interfaces of TiN film enhance the emission rate. However, the emission rate enhancements observed in the control samples are smaller than those provided by HMMs by about 2 times. This further serves as evidence for the enhanced PDOS in HMMs.

The high-k channels into which the emitter emits are confined only to HMM because no other surrounding medium supports them. Hence, these photons do not reach the detector causing an apparent reduction in the quantum yield. The quantum yield of the dye reduces drastically and the radiative decay rate (here radiative means radiation that reaches detector) is much smaller than on glass. The reason for this can be understood better with the help of FIG. 6(d). When the spacer thickness is small, the emitters emit most of their power into high-k modes in HMM. The power emitted into low-k modes that reach the detector is a tiny fraction for spacer layer less than 30 nm thick. This is the reason for small apparent quantum yield of the dye on HMMs with a thin spacer. As spacer layer is thinned, the power radiated to the upper-half space (to detector) increases slightly (see FIG. 6(d)). Hence, the radiative decay rate also increases slightly as the spacer layer is thinned. The apparent quantum yield being extremely small is a clear indication that the emitters are effectively probing the high PDOS of HMMs.

Figure 8:
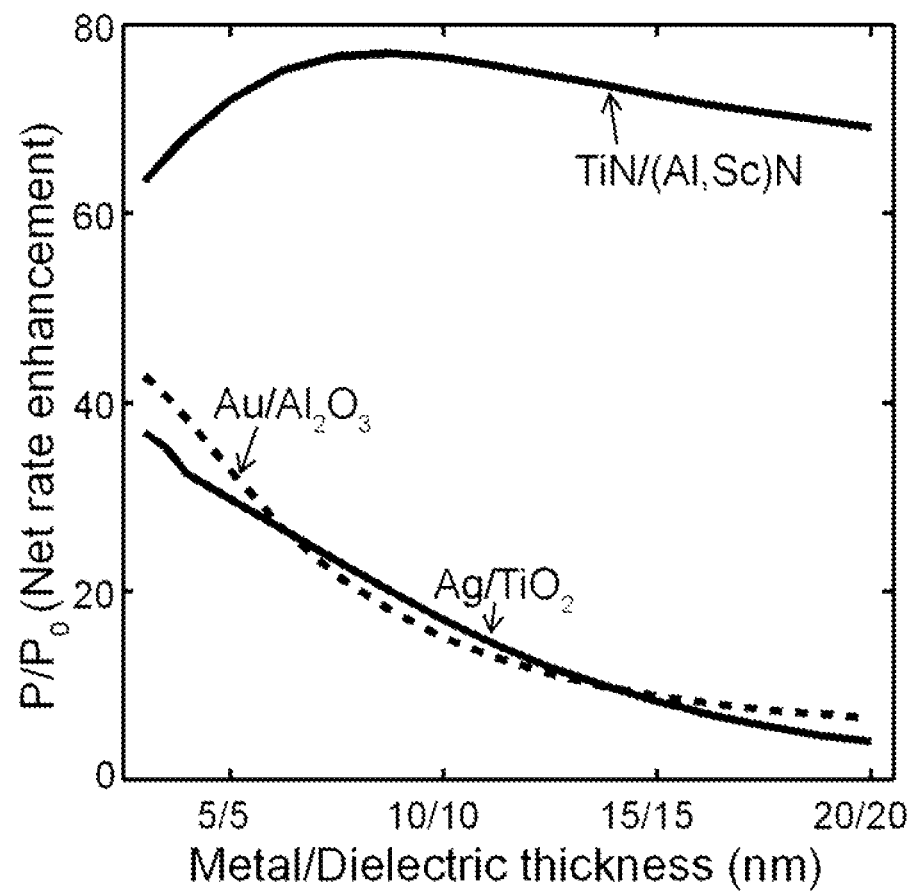
FIG. 8. Calculated emission rate enhancement Factor at $\lambda=720$ nm as a function of the superlattice periodicity. All calculations are made assuming that the emitters are separated from the HMM surface by a 5 nm thick spacer made from the dielectric that constitutes the superlattice. The enhancement factor is averaged to account for the spread of the emitters as in the layer of dye, over a distance of 11 nm. The orientation of the dipoles is assumed to be equally probable in all directions.

The PDOS of superlattice HMMs is also dependent on the thickness of the constituent layers. The largest k-vector of the photon that can propagate in the HMM depends inversely on the layer thickness. The thinner the layers, the larger the maximum k-vector of the propagating photon field. This increases the PDOS of the HMM because there are more high-k modes available for the emitter to radiate into. The limit to PDOS enhancement in HMMs is in general, imposed by the individual layer thickness. However, when the layers are made extremely thin, the PDOS enhancement might get limited by losses rather than the individual layer thickness. FIG. 8 shows the calculated normalized net power (into all possible k-modes) emitted by emitters sitting on top of HMMs composed of metal/dielectric layers of different thickness. For ideal emitters, this quantity is identical to the net enhancement in spontaneous decay rate. The curve for TiN/(Al,Sc)N HMMs shows that reducing the individual layer thickness increases the emission rate until it is about 7 nm. For layers thinner than 7 nm, losses start limiting the enhancement factor even before other effects such as non-locality begin to limit the enhancement in PDOS. This observation matches well with the measured lifetimes of dye molecules sitting on TiN/(Al,Sc)N HMMs with 5 nm and 10 nm individual layers. The dye lifetime measured on a TiN/(Al,Sc)N superlattice composed of 5 nm layers is 0.3985 ns, while that on a superlattice with 10 nm layers is 0.390 ns.

FIG. 8 also demonstrates which plasmonic material would provide larger PDOS to the HMM. The answer is not the obvious one, i.e., the lowest loss material. This is because the penetration depth of light depends both on real and imaginary parts of permittivity of the metal. A large negative permittivity would limit the penetration of light into the structure more severely, even more severely for higher-k waves. This is the reason for HMMs composed of noble metals performing poorly. The benefit of low loss of noble metals can be observed only when the layers have been made so thin that enough light can penetrate into these HMMs. This means that the curves in FIG. 8 corresponding to noble metals would show a maximum in enhancement only for much thinner layers. Unfortunately this requires noble metal layers to be as thin as a couple of nanometers, which is a big fabrication challenge. Moreover, losses shoot high when noble metal layers are as thin as a few nanometers. Also, non-local effects start to dominate and limit the PDOS enhancement for extremely thin layers. Thus, TiN turns out to be a better plasmonic material to get higher PDOS in HMMs.

In conclusion, the use of titanium nitride in hyperbolic metamaterials instead of noble metals marks a new era for this important class of optical metamaterials paving the way to realization of practical HMM devices that are low loss, CMOS- and bio-compatible, thermally stable and have controllable properties. Titanium nitride as the plasmonic material enables the long-awaited leap from previously demonstrated lossy HMMs based on thick, polycrystalline layers of metals and dielectrics to high-performance, truly binary superlattice HMMs consisting of ultra-thin, smooth, epitaxial layers that will ultimately unlock the full range of unusual properties of hyperbolic metamaterials.

Titanium nitride can serve as an alternative plasmonic material for plasmonic and metamaterial applications in the visible and near-IR optical frequencies. Titanium nitride, being a non-stoichiometric compound, exhibits process-dependent properties. Thin TiN films deposited on c-sapphire substrates show multivariant epitaxial growth and form smooth films. A comparative stud of TiN and conventional plasmonic materials suggested that TiN offers comparable performance for plasmonic applications and significantly better performance for transformation optics and metamaterial devices such as hyperbolic metamaterial devices. Titanium nitride is shown to support SPPs in the near-IR optical range by using dielectric gratings to excite SPPs on TiN/dielectric interfaces. An inherent advantage of TiN is that it is compatible with standard silicon manufacturing processes, unlike gold and silver. This allows easy integration of silicon electronics with plasmonics. Titanium nitride also overcomes any other nanofabrication problems associated with gold and silver, making it a technologically important alternative plasmonic material.

The description of a preferred embodiment of the invention, has been presented for proposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. A metamaterial, comprising:
ultrathin and smooth alternating layers of TiN operating as a plasmonic material and $Al_{1-x}Sc_xN$ operating as a dielectric material, the layers having sharp interfaces and forming a superlattice.

2. The metamaterial of claim 1, wherein the superlattice is pseudomorphic, epitaxial and grown on (001) MgO substrates, preferably at 750° C., having 002 crystal orientations.

3. The metamaterial of claim 1, further comprising a substrate of (001) MgO having a rocksalt crystal structure with a lattice constant of 4.21 that matches the lattice constants of $Al_{1-x}Sc_xN$ and TiN closely.

4. The metamaterial of claim 1, wherein each layer is from 1 to 20 nm thick.

5. The metamaterial of claim 1, wherein each layer is 5 nm thick.

6. The metamaterial of claim 1, wherein x is from 0.2 to 0.4.

7. The metamaterial of claim 1, wherein the dielectric material is $Al_{0.6}Sc_{0.4}N$.

8. The metamaterial of claim 1, wherein the dielectric material is $Al_{0.72}Sc_{0.28}N$.

9. The metamaterial of claim 1, wherein a photonic density of states is up to $10^6$ times enhanced compared to a photonic density in a free space in a broad wavelength range from 400 nm to 4000 nm due to a hyperbolic dispersion of a refractive index of the $TiN/Al_{1-x}Sc_xN$ metamaterial.

10. The metamaterial of claim 1, further comprising a solid, organic or polymer light emitting diode (LED) placed on top of the metamaterial, further comprising at least one array of plasmonic or dielectric antennas, gratings, apertures or metasurfaces for efficient light outcoupling providing LED efficiency increase in the range of 5-1000%.

11. An emission enhancer, comprising:
a broad band emitter, placed on top of a metamaterial slab, the slab consisting of alternating layers of TiN operating as a plasmonic material and $Al_{1-x}Sc_xN$ operating as a dielectric material, with a spacer made of $Al_xSc_{1-x}N$ of 5-20 nm thickness, combined with at least one outcoupling device, thus providing a single photon generator.

12. The enhancer of claim 11, wherein the outcoupling device being plasmonic or dielectric antenna, grating, aperture or metasurface.

13. The enhancer of claim 12, wherein the outcoupling device is a bow-tie spiral antenna.

14. The enhancer of claim 11, wherein the broad band emitter is nitrogen vacancy center in diamond.

15. The enhancer of claim 14, being implemented as a part of a quantum key distribution system to provide secure data transmission.

16. The enhancer of claim 12, wherein the broad band emitter is nitrogen vacancy center in diamond.

17. The enhancer of claim 16, being implemented as a part of a quantum key distribution system to provide the secure data transmission.

18. The enhancer of claim 16, wherein the outcoupling device is a bow-tie spiral antenna.

* * * * *